United States Patent
Walukiewicz et al.

(10) Patent No.: US 7,217,882 B2
(45) Date of Patent: May 15, 2007

(54) BROAD SPECTRUM SOLAR CELL

(75) Inventors: Wladyslaw Walukiewicz, Kensington, CA (US); Kin Man Yu, Lafayette, CA (US); Junqiao Wu, Richmond, CA (US); William J. Schaff, Ithaca, NY (US)

(73) Assignees: Cornell Research Foundation, Inc., Ithaca, NY (US); The Regents of the University of California, Oakland, CA (US)

( * ) Notice: Subject to any disclaimer, the term of this patent is extended or adjusted under 35 U.S.C. 154(b) by 366 days.

(21) Appl. No.: 10/445,711

(22) Filed: May 27, 2003

(65) Prior Publication Data

US 2004/0118451 A1   Jun. 24, 2004

Related U.S. Application Data

(60) Provisional application No. 60/383,500, filed on May 24, 2003, provisional application No. 60/409,844, filed on Sep. 10, 2002, provisional application No. 60/412,174, filed on Sep. 19, 2002.

(51) Int. Cl.
H01L 31/00    (2006.01)
(52) U.S. Cl. .................... 136/252; 136/262
(58) Field of Classification Search ........... 136/252, 136/262
See application file for complete search history.

(56) References Cited

U.S. PATENT DOCUMENTS 6,316,715 B1 * 11/2001 King et al. ............ 136/255
6,660,928 B1 * 12/2003 Patton et al. ............ 136/249

OTHER PUBLICATIONS

Davydov, V. Y., et al., "Band Gap of InN and In-Rich InxGa1—xN alloys (0.36 < x < 1)", *Phys. Stat. Sol.*, 230, (2002), R4-R6.
Hsu, L., et al., "Effect of polarization fields on transport properties in AlGaN/GaN heterostructures", *Journal of Applied Physics*, 89 (3), (Feb. 2001), 1783-1789.
Kim, K. S., et al., "Determination of the band-gap energy of Al/sub 1-x/In/sub x/N grown by metal-organic chemical-vapor deposition", *Applied Physics Letters*, 71 (6), (Aug. 1997), 800-802.
Lu, H., et al., "Effect of an AlN buffer layer on the epitaxial growth of InN by molecular-beam epitaxy", *Applied Physics Letters*, 79 (10), (Sep. 2001), 1489-1491.
Martin, G., et al., "Valence-band discontinuities of wurtzite GaN, AlN, and InN heterojunctions measured by X-ray photoemission spectroscopy", *Applied Physics Letters* 68 (18), (Apr. 1996), 2541-2543.
Nakamura, S., "InGaN-based blue light-emitting diodes and laser diodes", *Journal of Crystal Growth* 201-202, (May 1999), 290-295.
Pereira, S., et al., "Compositional dependence of the strain-free optical band gap in In/sub x/Ga/sub 1-x/N layers", *Applied Physics Letters*, 78 (15), (Apr. 2001), 2137-2139.

(Continued)

*Primary Examiner*—Nam Nguyen
*Assistant Examiner*—Anthony Fick
(74) *Attorney, Agent, or Firm*—Schwegman, Lundberg, Woessner & Kluth, P.A.

(57) ABSTRACT

An alloy having a large band gap range is used in a multijunction solar cell to enhance utilization of the solar energy spectrum. In one embodiment, the alloy is $In_{1-x}Ga_xN$ having an energy bandgap range of approximately 0.7 eV to 3.4 eV, providing a good match to the solar energy spectrum. Multiple junctions having different bandgaps are stacked to form a solar cell. Each junction may have different bandgaps (realized by varying the alloy composition), and therefore be responsive to different parts of the spectrum. The junctions are stacked in such a manner that some bands of light pass through upper junctions to lower junctions that are responsive to such bands.

33 Claims, 3 Drawing Sheets

OTHER PUBLICATIONS

Shan, W., et al., "Dependence of the fundamental band gap of Al/sub x/Ga/sub 1-x/N on alloy composition and pressure", *Journal of Applied Physics*, 85 (12), (Jun. 1999), 8505-8507.

Strite, S., et al., "GaN, AlN, and InN: a review", *Journal of Vacuum Science & Technology B (Microelectronics Processing and Phenomena)*, 10 (4), (Aug. 1992), 1237-1266.

Van Vechten, J. A., et al., "Electronic Structures of Semiconductor Alloys", *Physical Review B (Solid State)*, 1 (8), (Apr. 1970), 3351-3358.

Wu, J., et al., "Small band gap bowing in In/sub 1-x/Ga/sub x/N alloys", *Applied Physics Letters*, 80 (25), (Jun. 2002), 4741-4743.

Wu, J., et al., "Unusual properties of the fundamental band gap of InN", *Applied Physics Letters*, 80, (2002), 3967-3969.

Yamaguchi, Shigeo, et al., "Anomalous features in the optical properties of Al/sub 1-x/In/sub x/N on GaN grown by metal organic vapor phase epitaxy".

*Applied Physics Letters* 76 (7), (Feb. 2000), 876-878.

Zhang, X., et al., "Growth of Al/sub x/Ga/sub 1-x/N:Ge on sapphire and sillcon substrates", *Applied Physics Letters*, 67 (12), (Sep. 1995), 1745-1747.

* cited by examiner

BROAD SPECTRUM SOLAR CELL

RELATED APPLICATION(S)

This application claims the benefit of U.S. Provisional Application No. 60/383,500, filed May 24, 2002 and U.S. Provisional Application No. 60/409,844, filed Sep. 10, 2002 and U.S. Provisional Application No. 60/412,174, filed Sep. 19, 2002, which provisional applications are incorporated herein by references.

GOVERNMENT FUNDING

The invention described herein was made with U.S. Government support under Grant Number DE-AC03-76SF00098 awarded by the U.S. Department of Energy, Grant Number N00014-99-1-0936 awarded by Office of Naval Research, and Grant Number DMR-0109844 awarded by the National Science Foundation. The United States Government has certain rights in the invention.

FIELD OF THE INVENTION

The present invention relates to solar cells, and in particular to a broad spectrum solar cell.

BACKGROUND OF THE INVENTION

Current solar cells based on single semiconductor material have an intrinsic efficiency limit of approximately 31%. A primary reason for this limit is that no one material has been found that can perfectly match the broad ranges of solar radiation, which has a usable energy in the photon range of approximately 0.4 to 4 eV. Light with energy below the bandgap of the semiconductor will not be absorbed and converted to electrical power. Light with energy above the bandgap will be absorbed, but electron-hole pairs that are created quickly lose their excess energy above the bandgap in the form of heat. Thus, this energy is not available for conversion to electrical power.

Higher efficiencies were thought to be achievable by using stacks of semiconductor with different band gaps, forming a series of solar cells. The concept is that the higher gap materials convert higher energy photons, allowing lower energy photons to pass down to lower gap materials in the stack. Stacks of two semiconductors, GaInP/GaAs and three semiconductors GaInP/GaAs/Ge have been developed over the last decade, and have the highest efficiency of any solar cell. Because of the lack of appropriate semiconductor materials, attempts to make solar cell stacks with more junctions have actually resulted in lower efficiencies.

Currently most efficient tandem cells use fixed gap combinations, 1.85/1.43 eV for two junction cells and 1.85/1.43/0.7 eV for the three junction cells. The cells take advantage of the relatively good lattice match of $Ga_{0.5}In_{0.5}P$, GaAs and Ge. However the cells based on these fixed energy gap combinations do not take full advantage of the solar spectrum. There is a need for a solar cell that converts more of the light spectrum into electrical power.

SUMMARY OF THE INVENTION

An alloy having a large band gap range is used in a multijunction solar cell to enhance utilization of the solar energy spectrum. In one embodiment, the alloy is a single ternary alloy of $In_{1-x}Ga_xN$ having an energy bandgap range of approximately 0.7 eV to 3.4 eV, providing a good match to the solar energy spectrum.

In one embodiment, multiple junctions based on $In_{1-x}Ga_xN$ alloys having different bandgaps are stacked to form a solar cell. Each junction may have different bandgaps, and therefore be responsive to different parts of the spectrum. The junctions are stacked in such a manner that some bands of light pass through upper junctions to lower junctions that are responsive to such bands.

One example solar cell comprises two or more stacked junctions based on $In_{1-x}Ga_xN$ alloys, wherein the junctions having higher bandgaps are stacked on top of the junctions having lower bandgaps. Thus, lower energy light passes through the high bandgap junctions to the lower bandgap junctions where it is absorbed and converted to electrical power. The higher energy light is absorbed by the higher bandgap junctions and converted to electrical power.

In one embodiment, the solar cells comprise multiple stacked junctions formed of alloys with judiciously chosen compositions to cover substantially the entire solar spectrum.

The multijunction solar cells can be prepared as integrated devices consisting of the separate junctions sequentially deposited on substrate (integrated multijunction cell). One can also make separate junctions and stack them on the top of each other with mating conductors between them.

DETAILED DESCRIPTION OF THE INVENTION

In the following description, reference is made to the accompanying drawings that form a part hereof, and in which is shown by way of illustration specific embodiments in which the invention may be practiced. These embodiments are described in sufficient detail to enable those skilled in the art to practice the invention, and it is to be understood that other embodiments may be utilized and that structural, logical and electrical changes may be made without departing from the scope of the present invention. The following description is, therefore, not to be taken in a limited sense, and the scope of the present invention is defined by the appended claims.

Figure 1:
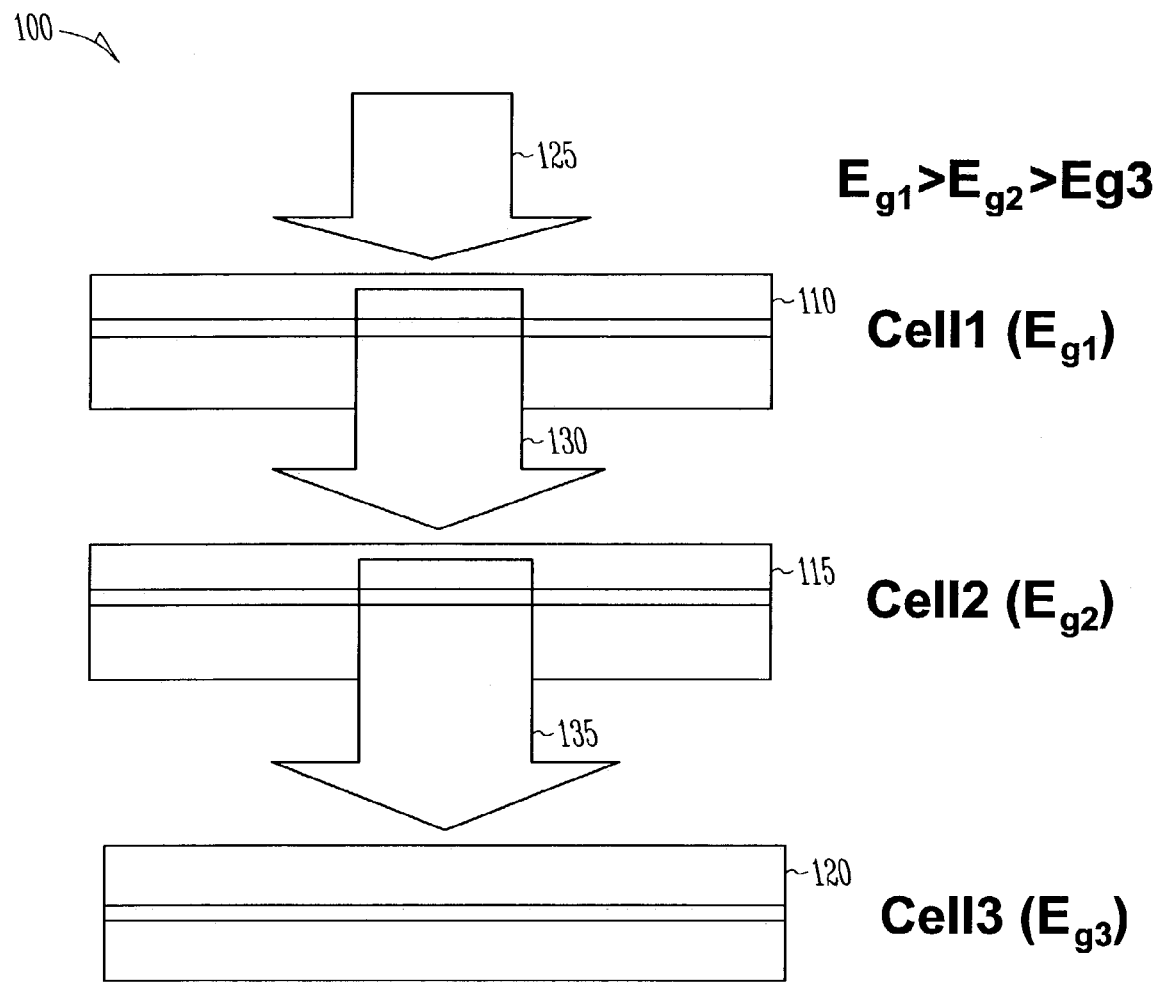
FIG. 1 is a block diagram representation of a multijunction solar cell according to an embodiment of the invention.

A block diagram abstract representation of a multi-junction solar cell is shown generally at 100 in FIG. 1. Three junctions, top, middle and bottom are shown at 110, 115, and 120. Each junction has a different bandgap, such that they absorb different energies of light. Light in the form of photons is represented by arrows 125, 130 and 135, which are generally indicative of the direction of the light. The bandgaps of the junctions generally decrease, such that higher energy photons represented by arrow 125 are absorbed by the top layer 110, lower energy photons 130 are absorbed by the middle junction 115, and still lower energy photons 135 are absorbed by the bottom junction 120. Further junctions may be provided if desired to absorb even a broader spectrum of light.

In one embodiment, the bandgap energies of the junctions, $E_{g1}$, $E_{g2}$, and $E_{g3}$ are selected to enable the junctions to absorb light having the highest energy in the spectrum of sunlight. A single ternary alloy having a large band gap range is used in the multijunction solar cell to enhance utilization of the solar energy spectrum. In one embodiment, the alloy is $In_{1-x}Ga_xN$ having an energy bandgap range of approximately 0.7 eV to 3.4 eV, providing a good match to the solar energy spectrum. The alloy is grown using molecular beam epitaxy, creating crystals with low electron concentrations and high electron mobilities.

Figure 2:
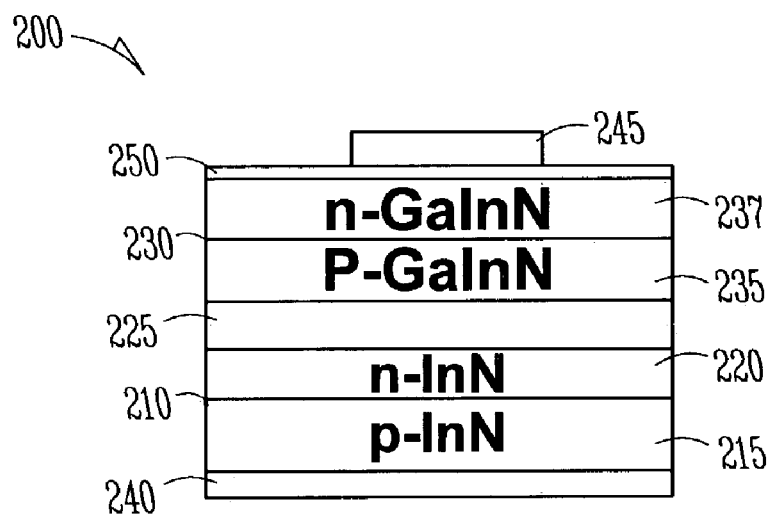
FIG. 2 is a block diagram of a two-junction solar cell according to an embodiment of the invention.

A block diagram of a two-junction solar cell is shown generally at 200 in FIG. 2. This cell has a maximum theoretical efficiency of 59% for example. Actual efficiency will likely be less. In one embodiment, a buffer layer is grown via an epitaxial deposition method on top of a substrate, such as a sapphire or silicon carbide substrate. The buffer layer provides a base for forming the two junction cell shown in FIG. 2. In one embodiment, the buffer layer is formed of GaN or AlN on a sapphire or a silicon carbide substrate. Other substrates may also be used. The substrate and buffer layer may be mechanically/chemically removed later, leaving the solar cell as shown at 200.

A low energy gap junction cell 210 is formed by growing a layer of p-type InN 215 followed by the layer of n-type InN 220. The layers have an energy gap of approximately 0.7 eV. A tunnel junction 225 comprising a heavily doped, n-type InN layer followed by heavily doped, p-type layer is then formed. In one embodiment, the heavily doped layers are approximately $10^{18}$ cm$^{-3}$ or higher electron/hole concentrations. The tunnel junction 225 provides an electrical connection between the low energy gap 210 and a large energy gap junction 230. Large energy gap junction cell 230 comprises a grown p-type $Ga_{0.39}In_{0.61}N$ (alloy with approximately 39% Ga and 61% In) 235 followed by n-type layer 237 of the same composition. The large energy gap junction 230 has an energy gap of approximately 1.4 eV. Ohmic (electrical) contacts 240 and 245 are formed on the bottom p-type layer of InN and the top n-type layer of $Ga_{0.39}In_{0.61}N$ respectively. An optional antireflection coating 250 is added to increase the amount of light absorbed and passing through the high energy gap junction 230. The 2-junction cells have a theoretical optimized maximum efficiency of approximately 59%.

Typical doping levels for n- and p-type layers range from $10^{17}$ cm$^{-3}$ to $10^{18}$ cm$^{-3}$. The actual doping levels depend on other characteristics of the films and can be adjusted to maximize the efficiency. Silicon is commonly used as an n-type dopant and magnesium as a p-type dopant in GaInN. Higher doping may be used if desired. Films of InN may have electron concentrations in the $10^{18}$ cm$^{-3}$ to $4.5 \times 10^{19}$ cm$^{-3}$ range and may have room temperature Hall mobilities ranging from several hundred up to 2050 cm$^2$/Vs when formed using molecular beam epitaxy.

In one embodiment, $In_{1-x}Ga_xN$ films are grown on (0001) sapphire with an AlN buffer layer (approximately 240 nm) by molecular beam epitaxy. The growth temperature is approximately between 470° C. to 570° C. High-quality wurtzite-structured $In_{1-x}Ga_xN$ epitaxial layers are formed with their c-axis perpendicular to the substrate surface. The composition dependence of the room temperature bandgap in the entire concentration range is well fit by the following standard equation:

$$E_g(x) = 3.42x + 0.77(1-x) - 1.43x(1-x)$$

with a constant bowing parameter of b=1.43 eV.

The thickness of the buffer layer in one embodiment ranges from 70 nm to 200 nm. The InN layer thickness is between approximately 200 nm and 4 um.

Figure 3:
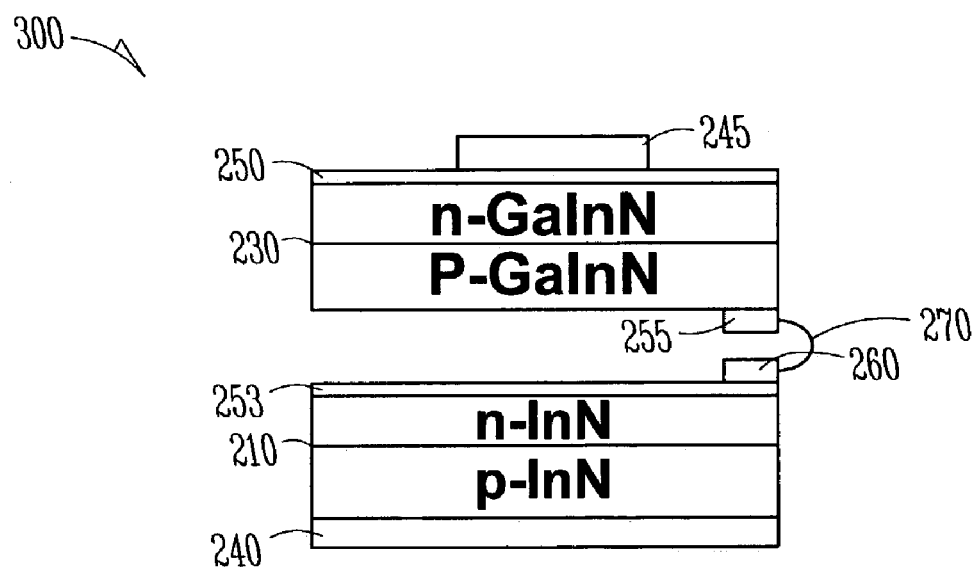
FIG. 3 is a block diagram of a mechanically stacked two-junction solar cell according to an embodiment of the invention.

In a further embodiment, the junction cells are mechanically stacked as shown at 300 in FIG. 3. The numbering of the junctions is consistent with that of FIG. 2 where appropriate. In this embodiment, each junction cell 210 and 230 is separately formed on a substrate utilizing the same process steps as above, and then are mechanically stacked. In addition, junction cell 210 has an optional antireflection coating 253 to minimize light reflection. Junction cell 230 has an ohmic contact 255 coupled to an ohmic contact 260 formed on junction cell 210 by a conductor 270. Metal (ohmic, low resistance) contacts are formed by evaporation or sputtering of a metal on semiconductor surfaces. Most metals form good ohmic contacts to n-type InN or GaInN although titanium seems to be most frequently used metal. Ohmic contacts to p-type material are more difficult to make. Gold forms the lowest resistivity contacts to p-type GaInN.

The junctions for the junction cells shown stacked at 300 are formed separately. The low energy gap junction cell 210 is formed by growing a GaN or AlN buffer layer on a substrate followed by p-type InN layer followed by n-type InN layer. The large energy gap junction cell 230 is formed by growing a GaN or AlN buffer layer on a substrate followed by p-type $Ga_{0.39}In_{0.61}N$ (alloy with approximately 39% of Ga and 61% of In) followed by n-type layer o the same composition. The layers have the energy gap of approximately 1.4 eV.

The large gap junction 230 is stacked on the top of the low gap junction cell 210. The n-type layer 220 of the low gap cell is connected to the p-type layer 235 of the large gap cell via electrical connection 270 through ohmic contacts (255, 260). The electrical contacts can have the form of a transparent wire grid formed of Indium-Tin-Oxide or other suitable conductive material. Transparent adhesive can be used to mechanically hold the layers together. Also antireflective coating can be applied to the top of each junction. Ohmic (electrical) contact is formed between the bottom p-type layer 215 of InN and the top n-type layer 237 of $Ga_{0.39}In_{0.61}N$.

Figure 4:
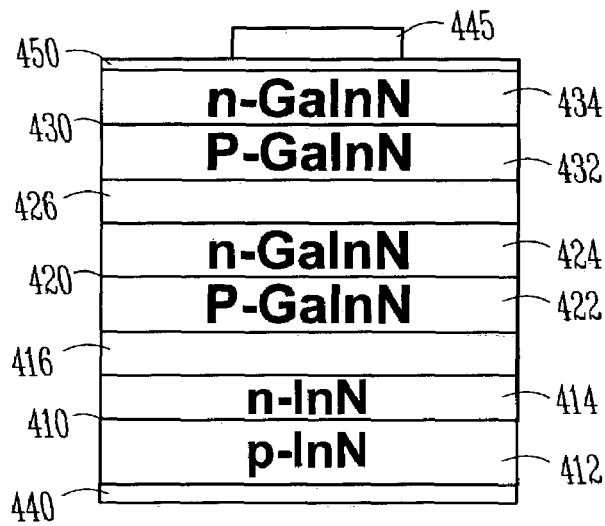
FIG. 4 is a block diagram of a three-junction solar cell according to an embodiment of the invention.

An integrated design of optimized 3-junction cells with the maximum theoretical efficiency of 67% is shown in FIG. 4 at 400. A buffer layer (not shown) is formed using an epitaxial deposition method to grow a layer of GaN or AlN on a sapphire or a silicon carbide substrate. The substrate and buffer layers may be mechanically/chemically removed later. A low energy gap junction cell 410 is grown and comprises a layer of p-type InN 412 followed by the layer of n-type InN 414. The layers have a gap of 0.7 eV.

A tunnel junction 416 is the grown. The tunnel junction 416 comprises a heavily doped n-type InN layer followed by heavily doped p-type layer. The junction 416 provides an electrical connection between the low energy gap to an intermediate energy gap cell 420.

Intermediate energy gap cell 420 has a junction of grown p-type $Ga_{0.27}In_{0.73}N$ (alloy with approximately 27% Ga and 73% In) layer 422 followed by n-type layer 424 of the same composition. The layers have the energy gap of approximately 1.16 eV. A tunnel junction 426 is then formed by growing a heavily doped n-type $Ga_{0.27}In_{0.73}N$ layer followed by heavily doped p-type layer. The junction provides an electrical connection between the intermediate energy gap cell and a large energy gap junction cell 430. The large energy gap junction cell 430 comprises a grown p-type $Ga_{0.55}In_{0.45}N$ (alloy with approximately 55% Ga and 45% of In) layer 432 followed by n-type layer 434 of the same composition. The layers have an energy gap of approximately 1.84 eV.

Ohmic (electrical) contacts 440 and 445 on the bottom p-type layer of InN and the top n-type layer of $Ga_{0.55}In_{045}N$. An antireflection coating 450 is formed on top of layer 434 prior to formation of contact 445 in one embodiment.

Figure 5:
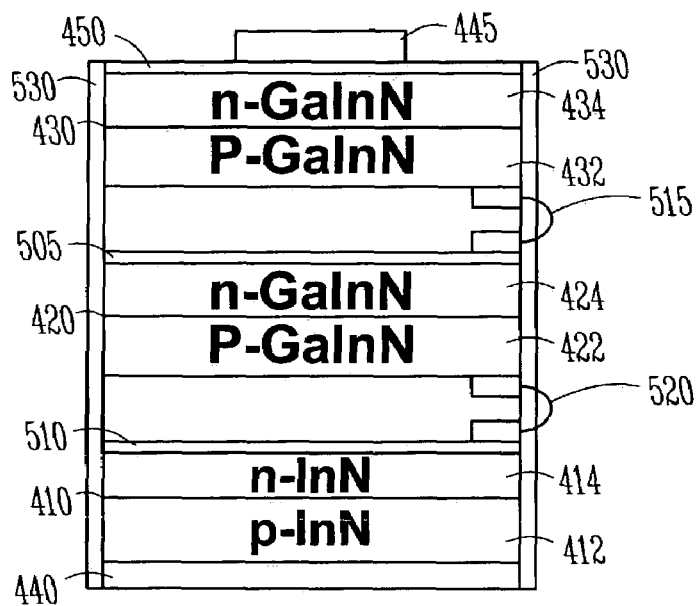
FIG. 5 is a block diagram of a mechanically stacked three-junction solar cell according to an embodiment of the invention.

FIG. 5 is an alternative three junction cell arrangement 500 where the individual cells are mechanically coupled. Numbering in FIG. 5 is consistent with that in FIG. 4. As in the mechanically coupled two junction cell, cells 410, 420 and 430 are separately formed, and then positioned in a vertically stacked arrangement to facilitate conversion of light to electricity. Each cell is provided with an antireflection coating 450, 505 and 510. The junctions are also electrically coupled by contacts formed between the cells at 515 and 520.

In one embodiment, the contacts are directly coupled to opposing contacts on adjacent cells to provide the mechanical coupling, and provide spacing between the cells. While the contacts are shown formed on one edge of the cells, the contacts may take any form (e.g. a wire grid) and distribution desired to provide a combination of mechanical and electrical coupling without significantly obstructing propagation of the sunlight. It may be desired to minimize the real estate of the cells covered by the contacts to optimize conversion efficiency. In further embodiments, mechanical coupling is accomplished by structures on sides of the cells. Still further mechanical coupling may be provided in a known manner, such as by a side support indicated at 530.

Three junction cell arrangement 500 has a theoretical optimized maximum efficiency of 67%. As indicated, the gap junctions are formed separately in one embodiment. Low energy gap junction cell 410 is formed on a grown GaN or AlN buffer layer on a substrate followed by p-type InN layer 412 followed by n-type InN layer 414.

Intermediate energy gap junction cell 420 is formed on a grown GaN or AlN buffer layer on a substrate followed by p-type $Ga_{0.27}In_{0.73}N$ (alloy with approximately 27% Ga and 73% In) layer 422, followed by n-type layer 424 of the same composition. The large energy gap junction cell is formed on a grown GaN or AlN buffer layer on a substrate followed by p-type $Ga_{0.55}In_{0.45}N$ (alloy with approximately 55% Ga and 45% of In) layer 432, followed by n-type layer 434 of the same composition. The layers have the energy gap of approximately 1.84 eV.

The junctions are stacked on top of each other in a sequence where the low energy gap is at the bottom followed by the intermediate energy gap followed by the large energy gap junction on the top. They are stacked in a manner that selected energies of light received at the large energy gap junction may progress through each of the other junctions.

As indicated above, the junctions are coupled mechanically, and then the n-type layer of the low gap junction is electrically coupled to the p-type layer of the intermediate gap junction and the n-type layer of the intermediate gap junction is electrically coupled to the p-type layer of the large gap junction. Ohmic (electrical) contacts are formed on the bottom p-type layer of InN and the top n-type layer of $Ga_{0.55}In_{0.45}N$. In further embodiments, larger numbers of junctions are use, each have different energy gaps designed to optimize absorption of incident light to more efficiently convert a large portion of energy in the solar spectrum.

CONCLUSION

The band gap range of the $In_{1-x}Ga_xN$ ternary alloy extends over a very wide energy range from 0.7 eV to 3.4 eV, and thus provides a good match to the solar energy spectrum. This creates the opportunity to synthesize material with any band gap within the solar spectrum and to design and fabricate new multijunction solar cells with any number of component junctions with optimized band gap. Such cells may approach theoretically predicted maximum efficiencies. The alloy may exhibit great thermal stability and radiation hardness that would be useful in harsh environments with radiation, making it suitable for space and military applications.

In one embodiment, multiple junctions having different bandgaps are stacked to form a solar cell. Each junction may have different bandgaps, and therefore be responsive to different parts of the spectrum. The junctions are stacked in such a manner that some bands of light pass through upper junctions to lower junctions that are responsive to such bands.

The alloy provides the ability to form solar cells with more then three junctions. In principle, any number of junctions may be used. For example, cells with four junctions would greatly improve efficiencies especially for outer space applications.

The examples of maximum efficiencies used herein are for typical terrestrial applications i.e. under Air Mass 1.5 direct normal irradiance (maximum light concentration). These are typical conditions commonly used to compare solar cell performance.

The invention claimed is:

1. A solar cell comprising:
   a first junction of $In_{1-x}Ga_xN$ having a first bandgap; and
   a second junction of $In_{1-x}Ga_xN$ having different composition, wherein x is between approximately 0 and 1, electrically coupled to the first junction, the second junction having a bandgap lower than the first bandgap, where the relative bandgaps are adjusted to a desired range of the solar spectrum.

2. The solar cell of claim 1 wherein the $In_{1-x}Ga_xN$ alloy has an energy bandgap range of approximately 0.7 eV to 3.4 eV.

3. The solar cell of claim 1 wherein the first junction is closer to a source of solar energy and has a higher bandgap than the second junction.

4. The solar cell of claim 3 wherein a surface of the first junction closer to a source of solar energy is coated with an antireflective layer.

5. The solar cell of claim 1 wherein the first junction comprises n-type and p-type doped GaInN.

6. The solar cell of claim 1 wherein the second junction comprises n-type and p-type doped InN.

7. The solar cell of claim 1 wherein the bandgap of the junctions is adjusted between approximately 0.7 eV to 3.4 eV by varying x.

8. The solar cell of claim 1 and further comprising electrical contacts formed on opposite sides of the first and second junctions.

9. A solar cell comprising:
   a first junction having a n-type and a p-type doped GaInN layer having a first bandgap within a solar radiation range;

a second junction having a n-type and a p-type doped InN layer having a bandgap lower than the first bandgap within the solar radiation range; and a tunnel junction sandwiched between the first and second junctions.

10. The solar cell of claim 9 wherein the first junction has an energy bandgap of approximately 1.4 eV and the second junction has an energy bandgap of approximately 0.7.

11. The solar cell of claim 10 wherein the first junction comprises $In_{1-x}Ga_xN$, where x is approximately 0.39.

12. The solar cell of claim 9 wherein the tunnel junction comprises an n-type and a p-type layer.

13. The solar cell of claim 12 wherein the tunnel junction layers are formed of InN.

14. The solar cell of claim 13 wherein the n-type layers are heavily doped.

15. The solar cell of claim 9 wherein doping levels for the n-type and p-type layers of the junctions range from approximately $10^{17}$ cm$^{-3}$ to $10^{18}$ cm$^{-3}$.

16. A solar cell comprising:
    a first junction having a n and a p doped GaInN layer having a first bandgap;
    a second junction having a n and a p doped InN layer having a second bandgap lower than the first bandgap;
    a front contact coupled to the first junction;
    a back contact coupled to the second junction;
    a set of interior contacts, wherein the interior contacts are coupled to respective first and second junctions, and aligned to provide electrical contact there between when the first and second junctions are in a stacked relationship.

17. The solar cell of claim 16 wherein the first junction has an energy bandgap of approximately 1.4 eV and the second junction has an energy bandgap of approximately 0.7 eV.

18. The solar cell of claim 16 wherein the first junction comprises $In_{1-x}Ga_xN$, where x is approximately 0.39.

19. A multijunction solar cell comprising:
    multiple electrically coupled junctions in stacked relationship, the junctions having a n-type and a p-type doped GaInN layer;
    a bottom junction positioned beneath, and electrically coupled to the stack of multiple junctions, the bottom junction having a n-type and a p-type doped InN layer, wherein the bottom junction has an energy bandgap within a solar radiation range, and the energy bandgap of each successive junction of the multiple stacked junctions from the bottom layer increases such that a top layer junction has the highest energy bandgap within the solar radiation range.

20. The solar cell of claim 19 wherein the junctions are formed of $In_{1-x}Ga_xN$, wherein x is between approximately 0 to 1, wherein x is varied to adjust the energy bandgap within the solar radiation range.

21. The solar cell of claim 20 wherein the energy bandgap of the bottom and multiple layers has a range of approximately 0.7 eV to 3.4 eV.

22. The solar cell of claim 20 wherein x is approximately zero for the bottom junction.

23. The solar cell of claim 20 comprising three junctions having x of approximately 0.55, 0.27 and 0.0, respectively.

24. The solar cell of claim 19 wherein the junctions are electrically coupled by a tunnel junction formed between each adjacent junction.

25. The solar cell of claim 19 wherein the junctions are electrically coupled by ohmic contacts formed on adjacent sides of successive junctions.

26. A method of forming a multijunction solar cell using a single alloy system, the method comprising:
    forming a first junction on top of a buffer layer supported by a substrate, wherein the first junction comprises $In_{1-x}Ga_xN$;
    forming a tunnel junction on top of the first junction;
    forming a second junction on top of the tunnel junction, wherein the second junction comprises $In_{1-x}Ga_xN$, wherein x for the second junction is larger than x for the first junction and maintains a junction energy bandgap within a solar radiation range, wherein x is between approximately 0 and 1;
    removing the buffer layer and the substrate layer; and
    forming contacts on the first junction and the second junction to form the solar cell.

27. The method of claim 26 and further comprising forming an antireflection coating on the second junction.

28. The method of claim 26 and further comprising forming further layers of tunnel junctions and junctions comprising $In_{1-x}Ga_xN$ between the first and second junctions, where x increases in successive junctions above the first junction.

29. The method of claim 26 wherein the first and second junctions are grown using molecular beam epitaxy.

30. A method of forming a multijunction solar cell, the method comprising:
    forming multiple junctions on top of buffer layers supported by a substrate, wherein the multiple junctions comprises $In_{1-x}Ga_xN$ wherein x is between approximately 0 and 1;
    removing the buffer layers and the substrate layers from each of the junctions;
    mechanically stacking the junctions such that a top of the stack is closest to a solar energy source, and wherein x decreases in each successive layer from the top and maintains a junction energy bandgap within a solar radiation range; and
    forming contacts on junctions to electrically connect each successive junction to adjacent junctions.

31. The method of claim 30 and further comprising forming an antireflection coating on each junction.

32. A solar cell comprising:
    a solar cell having multiple junctions formed of a single ternary alloy wherein the compositional percentage of the alloy is varied to produce multiple subcells of different bandgaps.

33. The solar cell of claim 32 wherein the multiple subcells are formed to be responsive to a full solar spectrum.

* * * * *

UNITED STATES PATENT AND TRADEMARK OFFICE
CERTIFICATE OF CORRECTION

| | | |
|---|---|---|
| PATENT NO. | : 7,217,882 B2 | Page 1 of 1 |
| APPLICATION NO. | : 10/445711 | |
| DATED | : May 15, 2007 | |
| INVENTOR(S) | : Walukiewicz et al. | |

It is certified that error appears in the above-identified patent and that said Letters Patent is hereby corrected as shown below:

On the face page, in field (60), under "Related U.S. Application Data", in column 1, line 2, delete "2003" and insert -- 2002 --, therefor.

On the face page, in field (56), under "Other Publications", in column 2, line 14, delete "Letters68" and insert -- Letters, 68 --, therefor.

On the face page, in field (56), under "Other Publications", in column 2, line 17, delete "Growthv" and insert -- Growth, v --, therefor.

In column 7, line 53, in Claim 20, delete "0 to 1" and insert -- 0 and 1 --, therefor.

Signed and Sealed this

Third Day of July, 2007

JON W. DUDAS
*Director of the United States Patent and Trademark Office*